(12) United States Patent
Kutlu

(10) Patent No.: US 7,479,703 B1
(45) Date of Patent: Jan. 20, 2009

(54) INTEGRATED CIRCUIT PACKAGE WITH SPUTTERED HEAT SINK FOR IMPROVED THERMAL PERFORMANCE

(75) Inventor: Zafer Kutlu, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/772,267

(22) Filed: Jul. 2, 2007

(51) Int. Cl.
*H01L 23/48* (2006.01)
(52) U.S. Cl. .................. 257/778; 257/737; 438/122
(58) Field of Classification Search ........... 257/720, 257/737, 678, 778; 438/122
See application file for complete search history.

(56) References Cited

U.S. PATENT DOCUMENTS 5,583,372 A * 12/1996 King et al. .................. 257/676
7,075,180 B2 * 7/2006 Narendra et al. ............ 257/707

* cited by examiner

*Primary Examiner*—Roy K Potter
(74) *Attorney, Agent, or Firm*—Eric James Whitesell

(57) ABSTRACT

An integrated circuit package includes an integrated circuit die having a circuit surface and a back surface opposite the circuit surface. A layer of ductile material is deposited on the back surface of the integrated circuit die.

11 Claims, 2 Drawing Sheets

INTEGRATED CIRCUIT PACKAGE WITH SPUTTERED HEAT SINK FOR IMPROVED THERMAL PERFORMANCE

BACKGROUND OF THE INVENTION

1. Field of the Invention

The present invention is directed to the design and manufacture of integrated circuits. More specifically, but without limitation thereto, the present invention is directed to an integrated circuit package.

2. Description of Related Art

In previous construction techniques for packaging a flip-chip integrated circuit die, a lid is attached to the backside of the die by a thermally conductive adhesive between the die and the lid. As integrated circuit die technology reduces the size of silicon, faster performance is achieved with higher density and smaller chips. The faster performance leads to increased power and the need for heat dissipation from a smaller chip area and package.

SUMMARY OF THE INVENTION

In one embodiment, an integrated circuit package includes an integrated circuit die having a circuit surface and a back surface opposite the circuit surface. A layer of ductile material is deposited on the back surface of the integrated circuit die.

In another embodiment, a method of making an integrated circuit package includes the following steps. An integrated circuit die is provided having a circuit surface and a back surface opposite the circuit surface. A layer of ductile material is deposited on the back surface of the integrated circuit die.

BRIEF DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Figure 1:
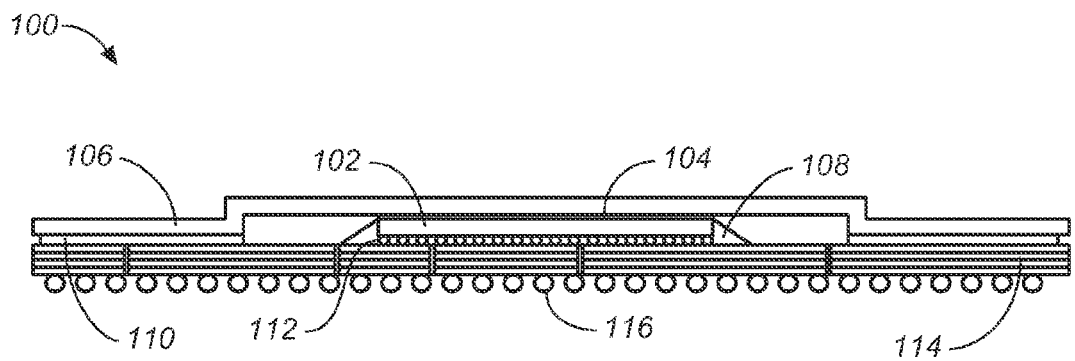
FIG. 1 illustrates a side view of a flip-chip integrated circuit package of the prior art.

FIG. 1 illustrates side view 100 of a flip-chip integrated circuit package of the prior art. Shown in FIG. 1 are an integrated circuit die 102, a thermal adhesive compound 104, a lid 106, underfill epoxy 108, lid seal epoxy 110, solder bumps 112, a substrate 114, and solder balls 116.

A disadvantage of using the thermally conductive adhesive 104 in the flipchip package 100 is that the thermally conductive adhesive 104 has a bulk thermal conductivity of typically about 1-3 W/mK (Watts per meter Kelvin). Further, the contact resistance of the thermal adhesive reduces the heat dissipation capability of the thermally conductive adhesive 104 by about 50 percent. As a result, the thermal conductivity between the integrated circuit die 102 and the lid 106 is insufficient to meet the heat dissipation requirement of the flipchip package when operating the integrated circuit die 102 within power specifications. To provide increased heat dissipation for smaller dies and packages with increased power, higher thermal conductivity and lower contact resistance is needed.

One method of increasing thermal conductivity developed in the prior art is to increase the filler content of the thermally conductive adhesive 104. However, increasing the filler content significantly reduces flow and dispensing properties of the thermal adhesive compound 104. Also, higher filler content increases the possibility of delamination of the thermal adhesive compound 104 from the lid or from the integrated circuit die 102. Further, increased filler content does not improve the contact resistance of the thermal adhesive compound 104 that reduces the effective thermal conductivity between the die and the lid. Another problem with increased filler content is that the thickness of the thermal adhesive compound 104 may not be reduced to less than about 50 microns. To avoid the problems encountered with the thermal adhesive compound 104, the lid may be omitted from the integrated circuit package.

Figure 2:
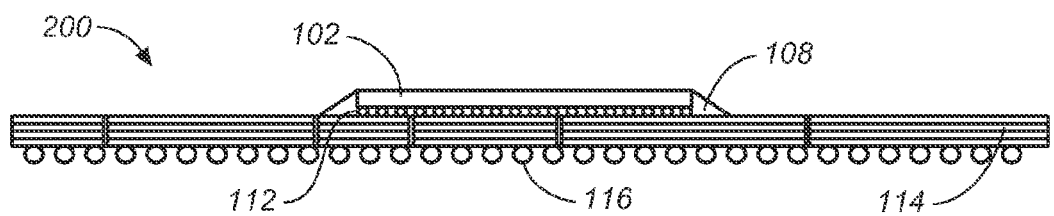
FIG. 2 illustrates a side view of the flip-chip integrated circuit package of FIG. 1 without a lid.

FIG. 2 illustrates a side view 200 of the flip-chip integrated circuit package of FIG. 1 without a lid. Shown in FIG. 2 are an integrated circuit die 102, underfill epoxy 108, solder bumps 112, a substrate 114, and solder balls 116.

In FIG. 2, the lid 106 and lid seal epoxy 110 are omitted from the package of FIG. 1 to improve heat dissipation performance of the integrated circuit die 102. However, if no lid is attached, the integrated circuit die 102 is susceptible to damage from handling during board level assembly and test processes as well as from accidental damage by an end user. Also, there is tensile stress on the integrated circuit die 102 due to the flipchip package construction. Because the integrated circuit die 102 is generally very brittle, a small external force/stress may result in breakage of the integrated circuit die 102. In addition, the identification marking typically made on the back surface of the integrated circuit die 102 may create stress concentration points that increase the risk of die fracture.

A preferred method is described below that overcomes the disadvantages of the prior art by leveraging the same techniques used in manufacturing flipchip integrated circuit packages. In addition, the method described below may also be used to improve thermal conductivity and reliability of other types of integrated circuit packages within the scope of the appended claims.

In one embodiment, an integrated circuit package includes an integrated circuit die having a circuit surface and a back surface opposite the circuit surface. A layer of ductile material is deposited on the back surface of the integrated circuit die.

Figure 3:
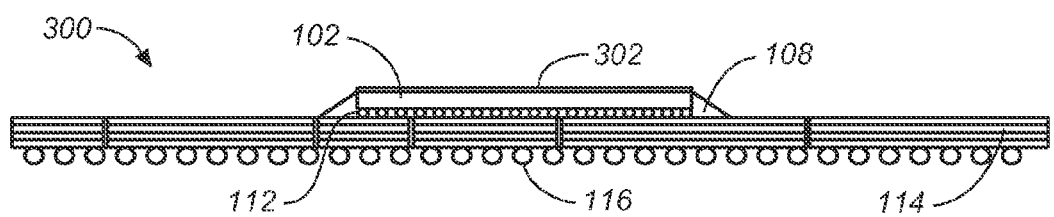
FIG. 3 illustrates a side view of an integrated circuit package having a layer of ductile material sputtered on the back surface of the integrated circuit die.

FIG. 3 illustrates a side view 300 of an integrated circuit package having a layer of a ductile metal sputtered on the back surface of the die. Shown in FIG. 3 are an integrated circuit die 102, underfill epoxy 108, solder bumps 112, a substrate 114, solder balls 116, and a layer of ductile material 302.

In FIG. 3, the layer of ductile material 302 is formed on the back surface of the integrated circuit die 102, for example, by a sputtering process typically used in semiconductor wafer production. Sputtering is a process widely used in the semiconductor manufacturing industry for depositing a thin film of a material on a substrate, for example, by a plasma of ions of the material carried by argon gas. Other film deposition techniques may also be used to practice various embodiments within the scope of the appended claims, for example, chemical vapor deposition. In a preferred embodiment, the ductile material is a metal, for example, titanium, aluminum, copper, or gold. The ductile property of the material absorbs energy by plastic deformation, that is, by changing shape without fracturing. As a result, the integrated circuit die 102 is protected from breakage during packaging and board level assembly, and tensile stress in the integrated circuit die is relieved by the energy absorbed by the layer of ductile material 302, for example, during marking of the die for identification. In addition, the heat capacity of the ductile material protects the integrated circuit die 102 from thermal failure by absorbing heat from the integrated circuit die 102 and distributing the heat uniformly over the surface of the ductile material to dissipate the heat generated by the integrated circuit die 102 more efficiently. The protection afforded to the integrated circuit die 102 by forming the layer of ductile material to conduct heat from the integrated circuit die 102 and/or forming the layer of ductile material to relieve the integrated circuit die 102 from tensile stress advantageously reduces loss of die to breakage and overheating, resulting in increased production yield and reliability.

In another embodiment, a method of making an integrated circuit package includes the following steps. An integrated circuit die is provided having a circuit surface and a back surface opposite the circuit surface. A layer of ductile material is deposited on the back surface of the integrated circuit die.

Figure 4:
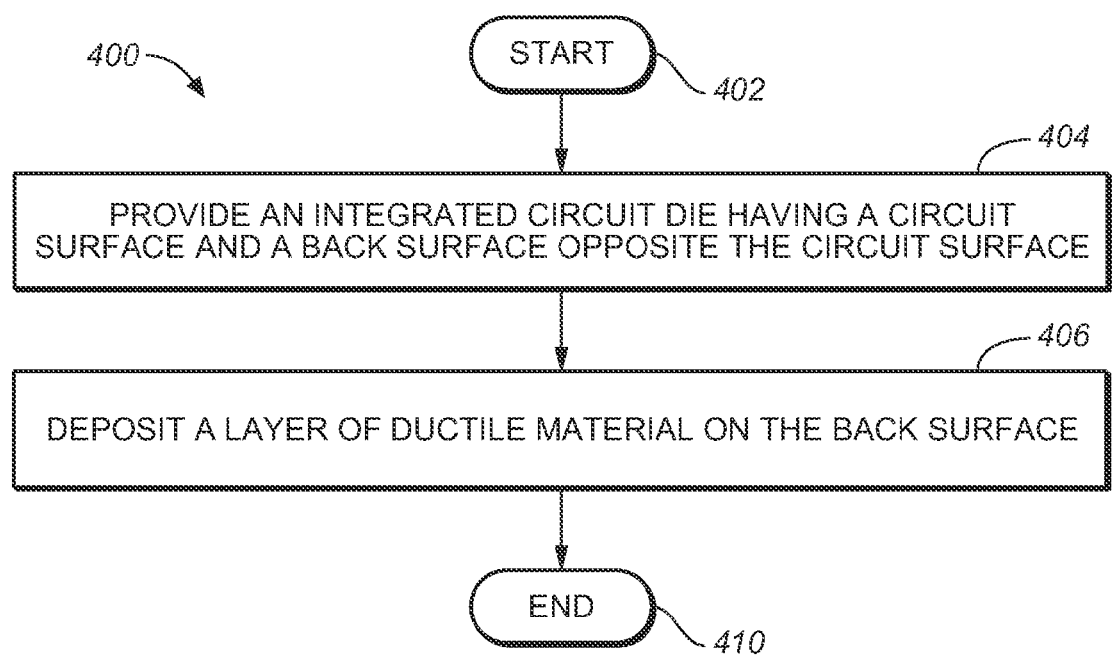
FIG. 4 illustrates a flow chart for making the integrated circuit package of FIG. 3.

FIG. 4 illustrates a flow chart 400 for making the integrated circuit package of FIG. 3.

Step 402 is the entry point of the flow chart 400.

In step 404, an integrated circuit die is provided having a circuit surface and a back surface opposite the circuit surface.

In step 406, a layer of ductile material, for example, aluminum, copper, or gold, is deposited on the back surface to protect the integrated circuit die. The deposition of the layer of ductile material may be performed, for example, by a film deposition process typically used in wafer processing or wafer bumping for a flipchip. The layer of ductile material is deposited to a thickness, for example, of one to five microns.

Step 408 is the exit point of the flow chart 400.

Although the method illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

The specific embodiments and applications thereof described above are for illustrative purposes only and do not preclude modifications and variations that may be made within the scope of the following claims.

What is claimed is:

1. An integrated circuit package comprising:
   an integrated circuit die having a circuit surface and a back surface opposite the circuit surface; and
   a layer of ductile material deposited on the back surface of the integrated circuit die, the layer of ductile material having a thickness of from one to five microns; and
   solder bumps formed on the circuit surface of the integrated circuit die to electrically connect the integrated circuit die to a package substrate.

2. An integrated circuit package comprising:
   an integrated circuit die having a circuit surface and a back surface opposite the circuit surface;
   a layer of ductile material deposited on the back surface of the integrated circuit die, the layer of ductile material having a thickness of from one to five microns; and
   an identification mark on the layer of ductile material.

3. An integrated circuit package comprising:
   an integrated circuit die having a circuit surface and a back surface opposite the circuit surface; and
   a layer of ductile material deposited on the back surface of the integrated circuit die, the layer of ductile material having a thickness of from one to five microns and comprising one of titanium, aluminum, copper, and gold.

4. An integrated circuit package comprising:
   an integrated circuit die having a circuit surface and a back surface opposite the circuit surface; and
   a layer of ductile material deposited on the back surface of the integrated circuit die, the layer of ductile material having a thickness of from one to five microns and formed to conduct heat from the integrated circuit die.

5. An integrated circuit package comprising:
   an integrated circuit die having a circuit surface and a back surface opposite the circuit surface; and
   a layer of ductile material deposited on the back surface of the integrated circuit die, the layer of ductile material having a thickness of from one to five microns and formed to relieve tensile stress from the integrated circuit die.

6. A method of making an integrated circuit package comprising steps of:
   providing an integrated circuit die having a circuit surface and a back surface opposite the circuit surface;
   depositing a layer of ductile material on the back surface of the integrated circuit die, the layer of ductile material deposited to a thickness of from one to five microns; and
   forming solder bumps on the circuit surface of the integrated circuit die to electrically connect the integrated circuit die to a package substrate.

7. A method of making an integrated circuit package comprising steps of:
   providing an integrated circuit die having a circuit surface and a back surface opposite the circuit surface;
   depositing a layer of ductile material on the back surface of the integrated circuit die, the layer of ductile material deposited to a thickness of from one to five microns; and
   making an identification mark on the layer of ductile material.

8. The method of claim 6 further comprising a step of depositing the layer of ductile material comprising one of titanium, aluminum, copper, and gold.

9. The method of claim 6 further comprising a step of forming the layer of ductile material to conduct heat from the integrated circuit die.

10. The method of claim 6 further comprising a step of forming the layer of ductile material to relieve tensile stress from the integrated circuit die.

11. An integrated circuit die comprising:
    a circuit surface and a back surface opposite the circuit surface;
    a layer of ductile material deposited on the back surface; and
    an identification mark on the layer of ductile material.

* * * * *